(12) United States Patent
Bhatia et al.

(10) Patent No.: US 9,189,052 B2
(45) Date of Patent: Nov. 17, 2015

(54) VOLTAGE REGULATION FOR DATA RETENTION IN A VOLATILE MEMORY

(71) Applicant: Apple Inc., Cupertino, CA (US)

(72) Inventors: Ajay Bhatia, Saratoga, CA (US); Michael Dreesen, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/296,066

(22) Filed: Jun. 4, 2014

(65) Prior Publication Data

US 2015/0228312 A1      Aug. 13, 2015

Related U.S. Application Data

(60) Provisional application No. 61/937,029, filed on Feb. 7, 2014.

(51) Int. Cl.
| | |
|---|---|
| *G11C 5/14* | (2006.01) |
| *G06F 1/32* | (2006.01) |
| *G06F 12/06* | (2006.01) |
| *G06F 12/02* | (2006.01) |
| *G11C 7/10* | (2006.01) |
| *G11C 11/419* | (2006.01) |

(52) U.S. Cl.
CPC .......... *G06F 1/3203* (2013.01); *G06F 12/0223* (2013.01); *G06F 12/06* (2013.01); *G11C 5/14* (2013.01); *G11C 5/147* (2013.01); *G11C 7/1096* (2013.01); *G11C 11/419* (2013.01); *G06F 2212/1016* (2013.01)

(58) Field of Classification Search
CPC .................................. G11C 5/14; G11C 8/08
USPC ......................................... 365/227, 200, 226
See application file for complete search history.

(56) References Cited

U.S. PATENT DOCUMENTS

| | | | |
|---|---|---|---|
| 7,999,605 B2 | 8/2011 | Seo | |
| 8,004,924 B2 | 8/2011 | Leomant et al. | |
| 8,385,134 B2 | 2/2013 | Yamaki | |
| 8,605,489 B2 | 12/2013 | Reohr et al. | |
| 2005/0218986 A1* | 10/2005 | Garlepp et al. | 330/259 |
| 2009/0024856 A1* | 1/2009 | Lee | 713/320 |
| 2010/0260219 A1* | 10/2010 | Daio et al. | 372/38.02 |
| 2012/0281447 A1* | 11/2012 | Heo et al. | 363/74 |
| 2014/0049574 A1* | 2/2014 | Hiyoshi et al. | 347/10 |
| 2014/0111139 A1* | 4/2014 | Chen et al. | 320/107 |

* cited by examiner

*Primary Examiner* — Michael Tran
(74) *Attorney, Agent, or Firm* — Meyertons, Hood, Kivlin, Kowert & Goetzel, P.C.

(57) ABSTRACT

A system, a voltage regulator and a method for regulating power are disclosed, wherein the system may include a processor, a voltage regulator circuit, and a memory unit. The voltage regulator circuit may be configured to generate a first power supply voltage provided to the memory unit. The voltage regulator circuit may be further configured to adjust a voltage level of two output nodes dependent upon a level of the first power supply voltage and a level of a reference voltage. The voltage regulator circuit may be further configured to adjust the level of the first power supply signal dependent upon the level of at least one of the two output voltages. The voltage regulating circuit may also provide the first output voltage to the second output voltage via an impedance.

20 Claims, 16 Drawing Sheets

US 9,189,052 B2

VOLTAGE REGULATION FOR DATA RETENTION IN A VOLATILE MEMORY

PRIORITY CLAIM

This application claims the benefit of U.S. Provisional Patent Application No. 61/937,029, filed on Feb. 7, 2014, and whose disclosure is incorporated herein by reference.

BACKGROUND

1. Technical Field

Embodiments herein are related to the field of integrated circuit implementation, and more particularly to the implementation of memory power management.

2. Description of the Related Art

Computing systems may include one or more systems-on-a-chip (SoC), which may integrate a number of different functions, such as, graphics processing, onto a single integrated circuit. A computing system may include memory, either as a part of the SoC, or as a separate die from the SoC and coupled by a memory controller. Various memories may be included, one or more on the die with the SoC and one or more separate to the SoC. Memories may be a significant part of the power consumption of a computing system, so for portable computing systems, such as, for example, laptops, smartphones, and tablets, it may be desirable to reduce the power consumption of one or more memories in the computing system.

One way of reducing the power consumption of a memory is remove power from the memory when it is not in use. For a volatile memory, however, the removal of power may result in a loss of data. A method for reducing power in a volatile memory without losing any data is to place the volatile memory into a data retention mode. A data retention mode may refer to a mode in which a memory may retain the data, but power consumption is reduced by limiting read and write operations to the memory, and reducing the supply voltage level to portions of the memory, such as, one or more memory sub-arrays, for example.

The lower voltage levels necessary for a data retention mode may require the use of a regulated power supply. A potential issue with the use of a regulated power supply is that a voltage drop may be introduced when switching a sub-array from an operational power supply to the regulated power supply due to the sudden increase in load on the regulated supply from the added sub-array.

A voltage regulation method is, therefore, desired that can respond quickly as sub-arrays are switched to and from the regulated supply. A system is disclosed herein that may provide for a voltage regulator capable of stabilizing quickly in response to sudden changes in loading, thereby reducing the magnitude of voltage drops.

SUMMARY OF THE EMBODIMENTS

Various embodiments of a memory are disclosed. Broadly speaking, a system, a voltage regulator circuit and a method are contemplated in which the system may include a processor, a memory unit including a plurality of sub-arrays coupled to the processor, and a voltage regulator circuit coupled to the memory. The voltage regulator circuit may be configured to generate a regulated supply signal with a lower voltage level than a power supply signal coupled to the memory unit. The regulated supply signal may also be coupled to the memory unit. The voltage regulator circuit may adjust a voltage level of a first output signal and a second output signal dependent upon the voltage level of the regulated supply signal and a voltage level of a reference voltage. The voltage regulator circuit may then adjust the voltage level of the regulated supply signal dependent upon the voltage level of the first output signal and/or the voltage level of the second output signal. Additionally, the voltage regulator circuit may couple the first output signal to the second output signal via an impedance.

In another embodiment, the memory unit may be configured to selectively couple the regulated supply signal to at least one of the plurality of sub-arrays. In a further embodiment, the memory unit may be further configured to decouple the regulated supply signal from the at least one of the plurality of sub-arrays, and couple the power supply signal to the at least one of the plurality of sub-arrays responsive to receiving a request from the processor to access a memory location in the at least one of the plurality of sub-arrays. In a still further embodiment, the memory unit may be further configured to decouple the power supply signal and couple the sleep supply signal to the given one of the plurality of sub-arrays responsive to a determination that the access of the memory location has completed.

In one embodiment, the impedance may include a capacitor in series with a resistor. In an alternate embodiment, the impedance may include a biased metal oxide semiconductor field-effect transistor (MOSFET). In another embodiment, the memory unit may be further configured to decouple the sleep supply signal and couple a secondary supply signal to the plurality of sub-arrays dependent upon a regulator enable signal.

BRIEF DESCRIPTION OF THE DRAWINGS

The following detailed description makes reference to the accompanying drawings, which are now briefly described.

FIG. 9, which includes

Figure 1:
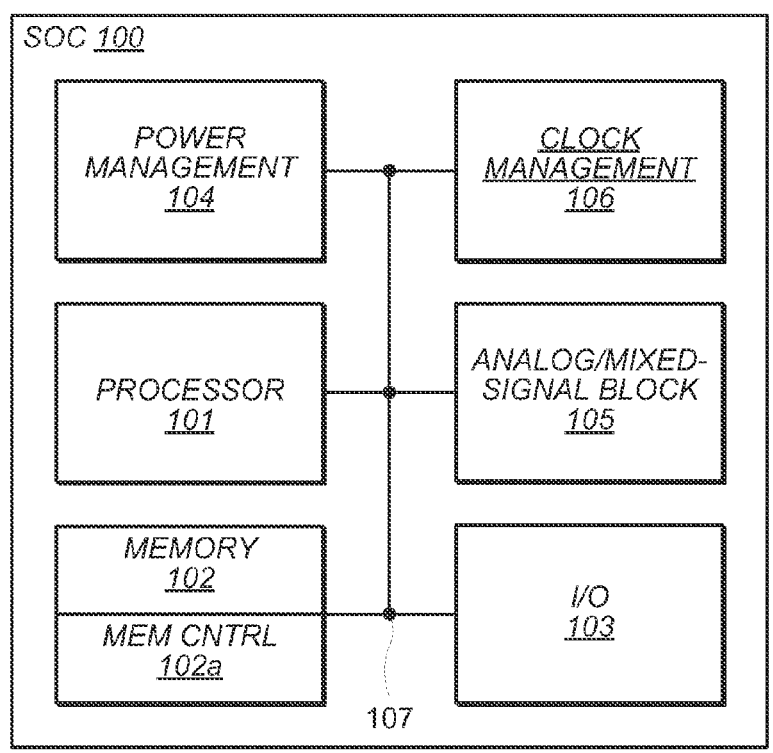
FIG. 1 illustrates a block diagram of an embodiment of a system-on-a-chip.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. 112, paragraph (f) interpretation for that element unless the language "means for" or "step for" is specifically recited.

DETAILED DESCRIPTION OF EMBODIMENTS

As computing system continue to evolve, power consumption has become an important factor in the design of such systems. Power consumption is of particular concern in mobile computing system. In some mobile computing system, power may be managed on a chip-by-chip basis, and in some cases, to a granularity of functional blocks within a given chip, to extend battery life.

Memories, which may be used to store data, program instructions, and the like, may be of particular concern when managing power consumption of a computing system. A memory may contain many copies of identical circuits which may remain idle for long periods of time. During such idle time, a circuit may consume static power, i.e., power due to leakage currents within the circuit. Various techniques may be employed to reduce the static power consumption of a memory circuit. Techniques, such as, e.g., the use of retention or sleep modes during idle periods, may help reduce static power consumption due to leakage current. Retention modes, however, may introduce additional latency into accesses to a memory, resulting from the time required to increase levels of power supplies to a point where normal operation is possible. The embodiments illustrated in the drawings and described below may provide techniques for managing power of a memory within a computing system that may reduce power consumption of a memory system, while limiting the impact on other performance parameters.

Many terms commonly used in reference to SoC designs are used in this disclosure. For the sake of clarity, the intended definitions of some of these terms, unless stated otherwise, are as follows.

A Metal-Oxide-Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an re-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples described herein, it is noted that any suitable logic process may be used for the circuits described in embodiments described herein.

It is noted that "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

The embodiments illustrated and described herein may employ CMOS circuits. In various other embodiments, however, other suitable technologies may be employed.

System-on-a-Chip Overview

A block diagram of an embodiment of an SoC is illustrated in FIG. 1. In the illustrated embodiment, the SoC 100 includes a processor 101 coupled to memory block 102, I/O block 103, power management unit 104, analog/mixed-signal block 105, and clock management unit 106, all coupled through bus 107. In various embodiments, SoC 100 may be configured for use in a mobile computing application such as, e.g., a tablet computer, cellular telephone, or smart phone.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include multiple CPU cores and may include one or more register files and memories.

In various embodiments, processor 101 may implement any suitable instruction set architecture (ISA), such as, e.g., PowerPC™, or x86 ISAs, or combinations thereof, as well as other ISAs. Processor 101 may include one or more bus transceiver units that allow processor 101 to communication to other functional blocks within SoC 100 such as, memory block 102, for example.

Memory block 102 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), or a Magnetoresistive Random Access Memory (MRAM), for example. Some embodiments may include a single memory, such as memory block 102 and other embodiments may include more than two memory blocks (not shown). In some embodiments, memory block 102 may be configured to store program instructions that may be executed by processor 101. Memory block 102 may, in other embodiments, be configured to store data to be processed, such as graphics data, for example.

Memory block 102 may include a memory controller 102a. Memory controller 102a may manage and direct memory accesses to multiple memory arrays. Using a memory interface, memory controller 102a may manage memory accesses to memories on a separate die from SoC 100. Memory controller 102a may include functions for accessing locations within memory 102. Memory controller 102a may receive access requests for reading or writing memory locations from processor 101. In some embodiments, memory controller may include a mapping of logical addresses used by processor 101 to physical addresses of memory 102. Memory controller 102a may receive a logical address from processor 101 as part of a read command and determine which memory array in memory 102 contains the received address.

I/O block 103 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 103 may be configured to implement a version of Universal Serial Bus (USB) protocol, IEEE 1394 (Firewire®) protocol, or, and may allow for program code and/or program instructions to be transferred from a peripheral storage device for execution by processor 101. In one embodiment, I/O block 103 may be configured to perform the data processing necessary to implement an Ethernet (IEEE 802.3) networking standard.

Power management unit 104 may be configured to manage power delivery to some or all of the functional blocks included in SoC 100. Power management unit 104 may comprise sub-blocks for managing multiple power supplies for various functional blocks. In various embodiments, the power supplies may be located in analog/mixed-signal block 105, in power management unit 104, in other blocks within SoC 100, or come from external to SoC 100, coupled through power supply pins. Power management unit 104 may include one or more voltage regulators to adjust outputs of the power supplies to various voltage levels as required by functional blocks within SoC 100.

Analog/mixed-signal block 105 may include a variety of circuits including, for example, a crystal oscillator, a phase-locked loop (PLL) or frequency-locked loop (FLL), an analog-to-digital converter (ADC), and a digital-to-analog converter (DAC) (all not shown). In some embodiments, analog/mixed-signal block 105 may also include, in some embodiments, radio frequency (RF) circuits that may be configured for operation with cellular telephone networks. Analog/mixed-signal block 105 may include one or more voltage regulators to supply one or more voltages to various functional blocks and circuits within those blocks.

Clock management unit 106 may be configured to select one or more clock sources for the functional blocks in SoC 100. In various embodiments, the clock sources may be located in analog/mixed-signal block 105, in clock management unit 106, in other blocks with SoC 100, or come from external to SoC 100, coupled through one or more I/O pins. In some embodiments, clock management unit 106 may be capable of dividing a selected clock source before it is distributed throughout SoC 100. Clock management unit 106 may include registers for selecting an output frequency of a PLL, FLL, or other type of adjustable clock source. In such embodiments, clock management unit 106 may manage the configuration of one or more adjustable clock sources and may be capable of changing clock output frequencies in stages in order to avoid a large change in frequency in a short period of time.

System bus 107 may be configured as one or more buses to couple processor 101 to the other functional blocks within the SoC 100 such as, e.g., memory block 102, and I/O block 103. In some embodiments, system bus 107 may include interfaces coupled to one or more of the functional blocks that allow a particular functional block to communicate through the bus. In some embodiments, system bus 107 may allow movement of data and transactions (i.e., requests and responses) between functional blocks without intervention from processor 101. For example, data received through the I/O block 103 may be stored directly to memory block 102.

It is noted that the SoC illustrated in FIG. 1 is merely an example. In other embodiments, different functional blocks and different configurations of functional blocks may be possible dependent upon the specific application for which the SoC is intended. It is further noted that the various functional blocks illustrated in SoC 100 may operate at different clock frequencies.

Figure 2:
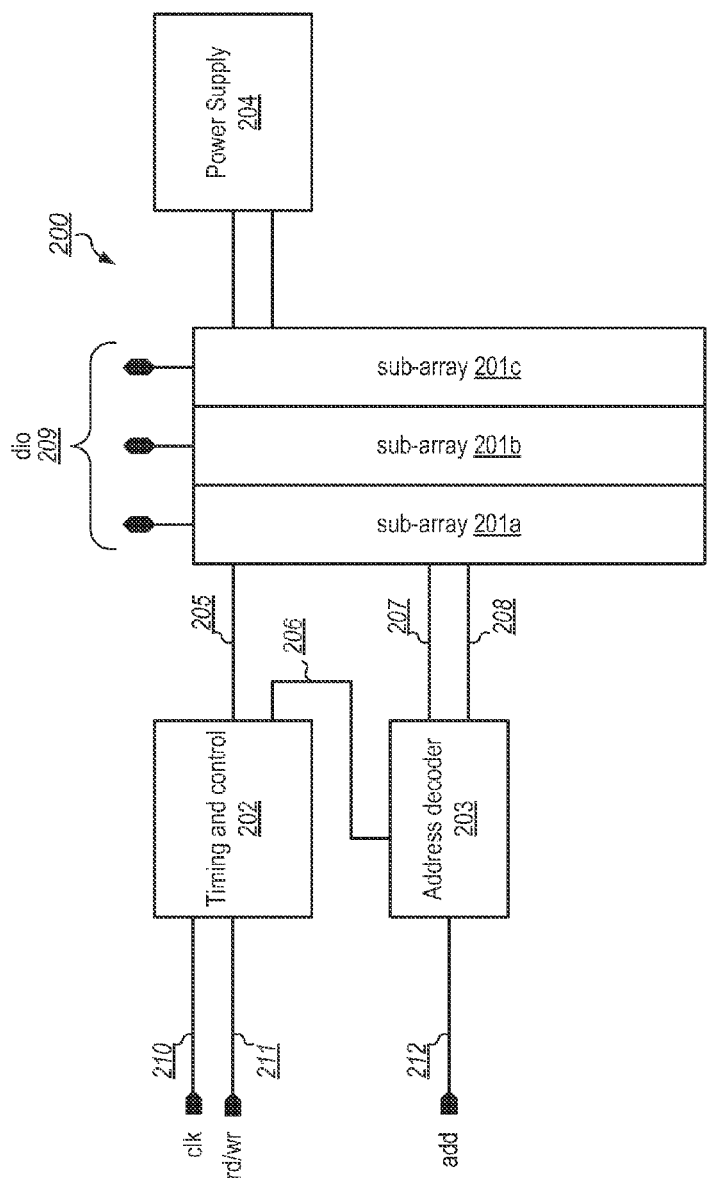
FIG. 2 illustrates a block diagram of an embodiment of a memory system.

Turning to FIG. 2, an embodiment of a memory system is illustrated. FIG. 2 illustrates a memory according to one of several possible embodiments. In the illustrated embodiment, memory 200 includes data I/O ports 209 denoted "dio," an address bus input 212 denoted "add," mode selection inputs 211 denoted "mode," and a clock input 210 denoted "clk."

In the illustrated embodiment, memory 200 includes sub-arrays 201a, 201b, and 201c, timing and control unit 202, and address decoder 203. Sub-arrays 201a, 201b, and 201c may incorporate some or all of the features described above with respect to sub-arrays 300. Timing and control unit 202 is coupled to provide a decoder enable signal 206 to address decoder 203, and control signals 205 to sub-arrays 201a, 201b, and 201c. Power supply 204 is coupled to sub-arrays 201a, 201b, and 201c to provide one or more power supply signals to sub-arrays 201.

Timing and control unit 202 may determine a type of memory access command by the state of mode selection inputs 211. Dependent upon the states of mode selection inputs 211, timing and control unit 202 may assert corresponding states on control signals 205 in order to configure sub-arrays 201 for a read or write command accordingly. Control signals 205 may include a read control signal and a write control signal, not shown.

Address decoder 203 is coupled to provide row selects 207 and column selects 208 to sub-arrays 201a, 201b, and 201c, in response to the assertion of decoder enable signal 206 and the address value on address bus 212. In some embodiments, address bus 212 may go through timing and control unit 202 before going to address decoder 203. In such embodiments, a logical address to physical address mapping may be performed before sending the address to address decoder 203. Timing and control unit 202 provides the control signals 205 to operate sub-arrays 201a, 201b, and 201c, as well as enable address decoder 203. In some embodiments, control signals 205 may include a sense amplifier enable signal and pre-charge control signals.

Power supply 204 may provide two or more voltage signals to memory sub-arrays 201. In some embodiments, power supply 204 may be included in power management unit 104 in FIG. 1. In other embodiments, power supply 204 may be included in memory block 102 in FIG. 1. Power supply 204 may provide different voltage levels on each of the two or more supply signals to memory sub-arrays 201. The two or more supply signals may be provided at all times while memory 200 is active or one or more of the supply signals may be enabled and disabled as needed by timing and control unit 202. Enabling and disabling of the supply signals may depend on timing and control unit 202.

It is noted that the embodiment of memory 200 as illustrated in FIG. 2 is merely an example. The numbers and types of functional blocks may differ in various embodiments. For example, in other embodiments, more than two supply signals may be employed.

Reduced Leakage Address Decode

Figure 3:
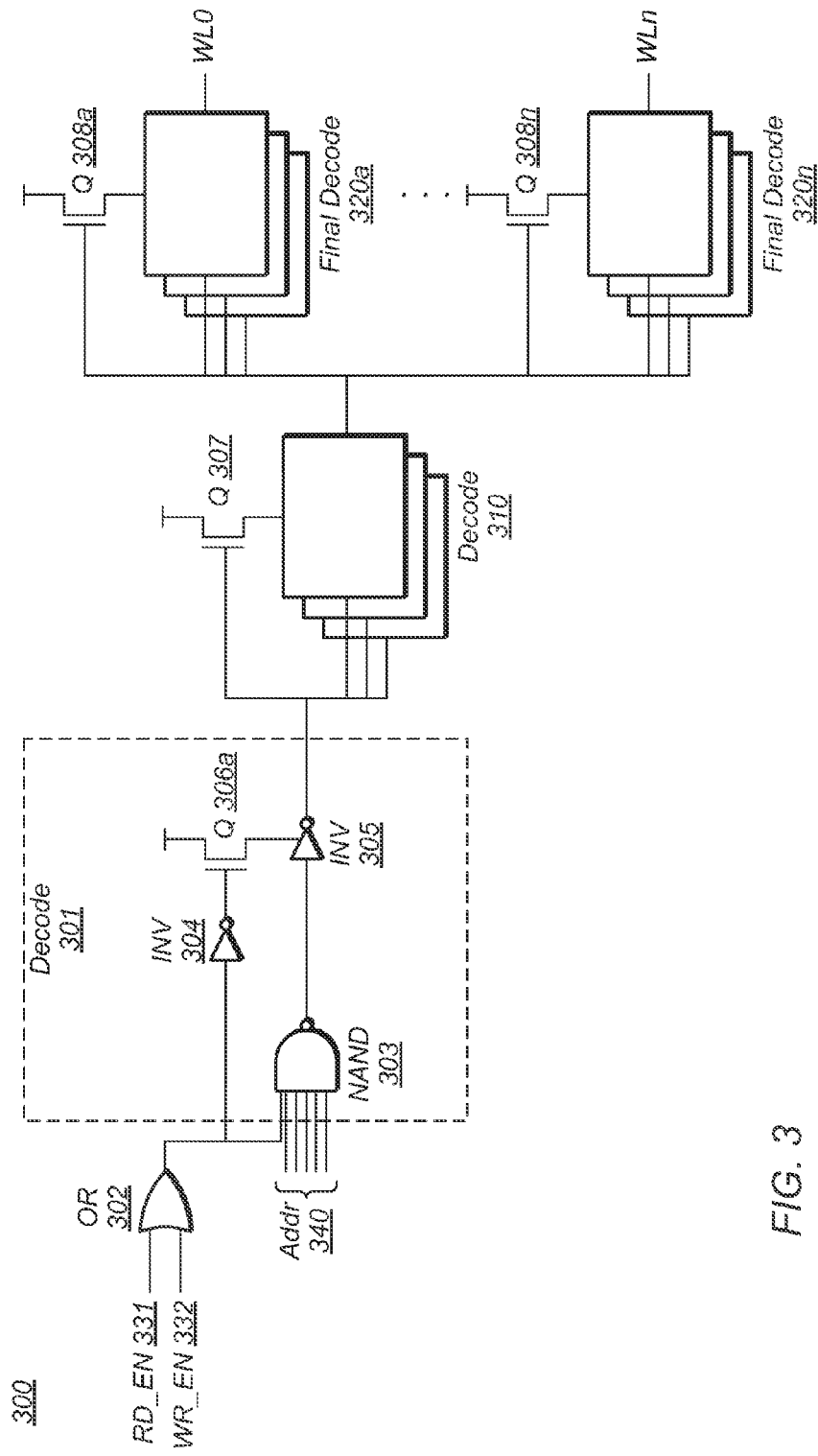
FIG. 3 illustrates an embodiment of address decoding logic.

Turning to FIG. 3, an embodiment of an address decoder for a memory is illustrated. Address decoder 300 may correspond to address decoder 203 in FIG. 2 and may include several stages of address decoders, such as decoder stage 301, decoder stage 310, and final decoder stages 320a-320n. Input signals, read enable (RD_EN) 331 and write enable (WR_EN) 332, may be combined by OR gate 302 and input into decode stage 301 along with address 340.

Decode stage 301 may perform a first step in decoding the memory address to determine which sub-array of a plurality of sub-arrays, such as sub-arrays 201 in FIG. 2, contain the memory location corresponding to the address. Decode stage 301 may include NAND gate 303, inverter 304, controlled inverter 305, and transistor Q306. It is noted that, in various embodiments, a "transistor" may correspond to one or more transconductance elements such as a MOSFET as described above or a junction field-effect transistor (JFET), for example.

The output of OR 302 may be asserted if either read enable 331 or write enable 332 are asserted. The assertion of OR 302 may cause NAND 303 to perform a first decode on address 340. The output of OR 302 may also be inverted by inverter 304 and used to enable Q306 which may in turn enable inverter 305. If inverter 305 is enabled, then the output of NAND 303 may be able to pass through to the second stage of decoders, decoder stage 320. While only a single decode stage 301 is illustrated, decoder stage 301 may be repeated as necessary in a first address decoding stage dependent upon a number of address lines being decoded. By using read enable 331 and write enable 332 to enable NAND 303 and inverter 305, leakage current, and therefore, power, may be reduced when neither read enable 331 or write enable 332 are asserted.

Static complementary metal-oxide-semiconductor (CMOS) inverters, such as those shown and described herein, may be a particular embodiment of an inverting amplifier that may be employed in the circuits described herein. In other embodiments, however, any suitable configuration of inverting amplifier that is capable of inverting the logical sense of a signal may be used, including inverting amplifiers built using technology other than CMOS.

Static OR gates, such as those shown and described herein, may be implemented according to several design styles. For example, an OR gate may be implemented as a NOR gate whose output is coupled to an inverter. In other embodiments, an OR gate may be constructed from multiple NAND gates, multiple NOR gates, or any suitable combination of logic gates.

Moving to the second stage, one or more outputs of decode stage 301 may be provided to decode stages 310. Each decode stage 310 may receive one or more outputs from decode stages 301 and using logic similar to decode stage 301, further decode address 340. Decode stages 310 may also include transistors Q307 which may enable or disable the decode logic within each of the decode stages 310. By including Q307, a given stage for which the input signals will cause the stage's output to be low may be preemptively disabled, thereby further contributing to reduce power consumption.

Address decoder 300 may include additional stages similar to decode stages 310 as needed to decode all potential addresses in the memory. Final decode stages 320 may function similar to decode stages 310. The outputs of final decode stages 320 may correspond to word line signals, WL0 through WLn. For a given value of address 340, a single word line signal may be asserted, which may correspond to a sub-array 210 containing the memory location being addressed. In various embodiments, any number of final decode stages 320 may be included, corresponding to a number of word lines necessary to address the entire memory array.

It is noted that the embodiment illustrated in FIG. 3 is merely an example. In other embodiments, different circuit implementations and different number of decoding stages may be employed.

Figure 4:
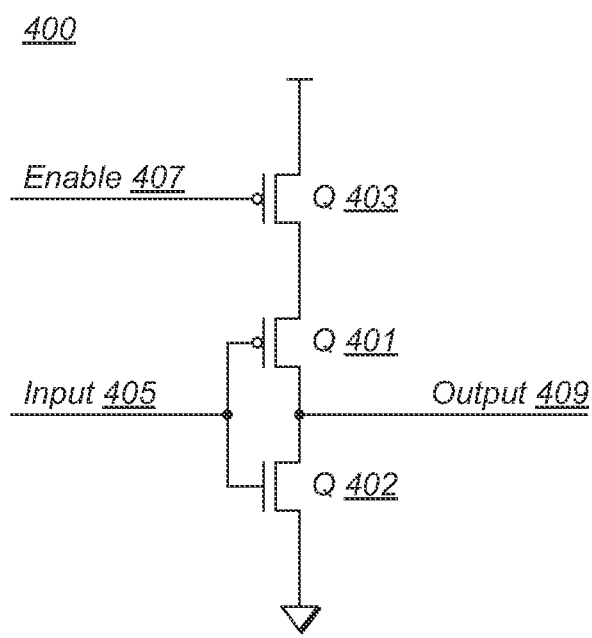
FIG. 4 illustrates an embodiment of a controlled inverter.

Moving now to FIG. 4, an embodiment of circuit including a controlled inverter with a corresponding enable signal is illustrated. Circuit 400 may correspond to inverter 305 and transistor 306 in FIG. 3. Circuit 400 may include p-channel MOSFETS Q401 and Q403, and n-channel MOSFET Q402.

Input 405 may be an input signal to the inverter of circuit 400. Output 409 may correspond to the inverted value of input 405. Enable 407 may be an active low signal such that if enable 407 is low, Q403 is on and conducts a supply voltage to Q401. Q401 and Q402 form an inverter such that when input 405 is low, Q401 is on and Q402 is off, and output 409 is therefore high. When input 405 is high, Q401 is off and Q402 is on, resulting in output 409 being low. If enable 407 is high, Q403 is off and output 409 may not be driven high since the supply voltage is blocked by Q403. The inclusion of enable 407 and Q403, may, in some embodiments, reduce leakage current through Q401 when the inverter is not being used. Having two p-channel MOSFETs in series as illustrated may reduce leakage current through Q401 when both Q401 and Q403 are off as compared to if Q401 were coupled directly to the supply voltage. In other embodiments, a similar result may be possible by adding an n-channel MOSFET between Q402 and the ground reference.

It is noted that FIG. 4 is merely an example for the purposes of illustration. Other embodiments may include additional transistors, signals, as well as different configurations of transistors. For example, although the transistors in FIG. 4 are presented as MOSFETs, in other embodiments, any suitable type or types of transistors may be used.

Figure 5:
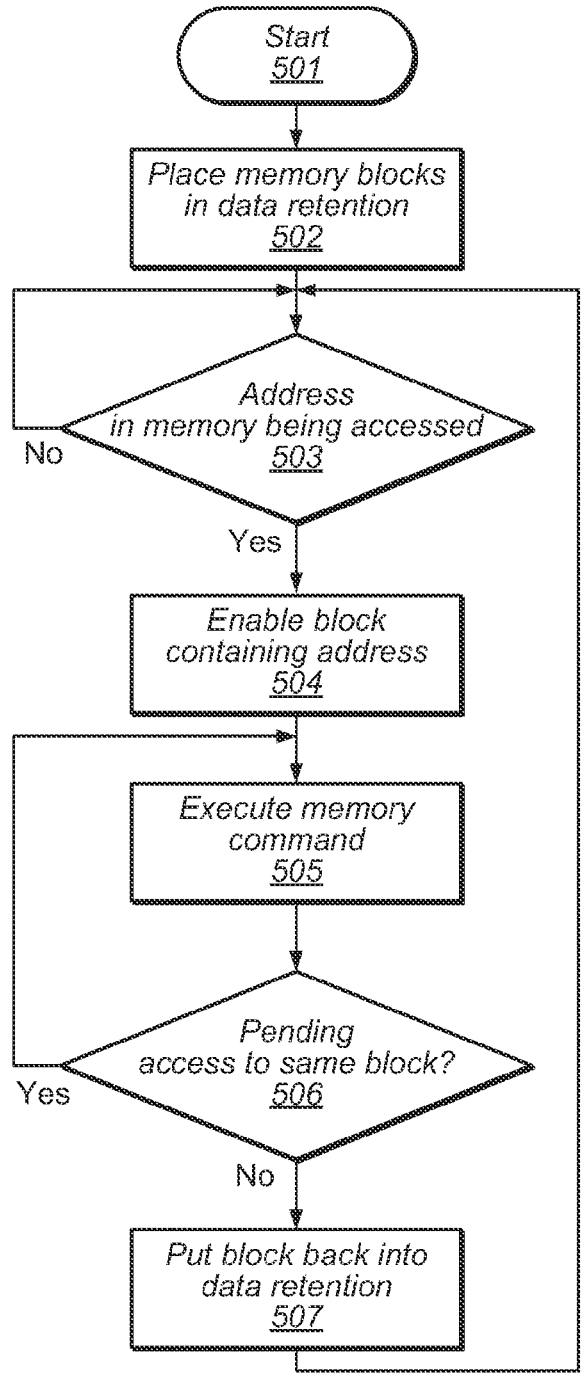
FIG. 5 illustrates a flowchart of an embodiment of a method for managing power in a memory system.

Turning to FIG. 5, a method is illustrated for using an address decoder to select an addressed sub-array in a memory with multiple sub-arrays, such as, for example, sub-arrays 201 of memory 200 in FIG. 2. Referring collectively to SoC 100 in FIG. 1, memory 200 in FIG. 2 and the flowchart in FIG. 5, the method may begin in block 501.

Sub-arrays 201 may be placed into a data retention mode (block 502). In various embodiments, a limited number of sub-arrays 201 or all sub-arrays 201 of memory 200 may be placed into the data retention mode. In addition to sub-arrays 201 being placed into the data retention mode, a voltage level being supplied to various blocks within memory 200 may be reduced to a sleep mode voltage level.

The method may depend on an address located in memory 200 being accessed by a processor in the system, such as, for example, processor 101 from FIG. 1 (block 503). Processor 101 may issue a command that may access a memory location. In response, memory controller 102a may convert a logical address provided by processor 101 into a physical address. Memory controller may determine which memory array contains the physical address and provide the physical address and a read or write signal to the memory array containing the address. If memory 200 includes the address, the method may move to block 504. Otherwise, the method may remain in block 503 for a next memory access.

The method may now enable the memory block containing the accessed address (block 504). The physical address and the read/write signal may be provided to memory 200. Address decoder 203 may decode the address provided and assert a corresponding word line. The sub-array containing the asserted word line, for example, sub-array 210b, may be placed into a normal operating mode. In some embodiments, enabling sub-array 210b may include switching the voltage supply to a supply signal with a higher voltage level for performing memory operations on sub-array 210b.

Address decoder 203 may correspond to address decoder 300 in FIG. 3. In the process of decoding the received address, address decoder 300 may decode the address in two or more stages. At each stage, as described in relation to FIG. 3, only certain pieces of the decoder stage may be enabled by way of power headers, in order to conserve power. In some embodiments, power headers may be switches, implemented by transistors such as Q306, Q307 and Q308 in FIG. 3, for example, that decouple circuits from their voltage supply. By using power headers, address decoder 300 may be able to limit the number of circuits in the decode logic that are powered for decoding a received address such that only logic circuits related to the received address receive power. The power headers may reduce leakage through the other portions of the address decoder 300 circuits that are not necessary for decoding the received address.

Once sub-array 210b is enabled and ready to be accessed, the command from processor 101 may be executed (block 505). The command may include reading or writing of one or more address locations within sub-array 210b. Enabling sub-array 210b, in some embodiments, may not add significant time for the memory access when compared to accessing a sub-array that has not been placed into data retention mode. In other words, the command may take just as long to execute from sub-array 210b as it would from another similar sub-array that was already enabled.

The method may now depend on a determination if another memory access to sub-array 210b is pending (block 506). If another access to sub-array 210b is pending, then the method may return to block 505 to execute the pending command.

If no pending accesses to sub-array 210b are detected, then sub-array 210b may be placed back into data retention mode (block 507). In various embodiments, a voltage level being supplied to sub-array 210b may be reduced. The method may return to block 503 to wait for another address located within the memory blocks placed in data retention mode.

It is noted that the method illustrated in FIG. 5 is merely an example embodiment. Although some of operations illustrated in FIG. 5 are depicted as being performed sequentially, in other embodiments, one or more of the operations may be performed in parallel.

Figure 16:
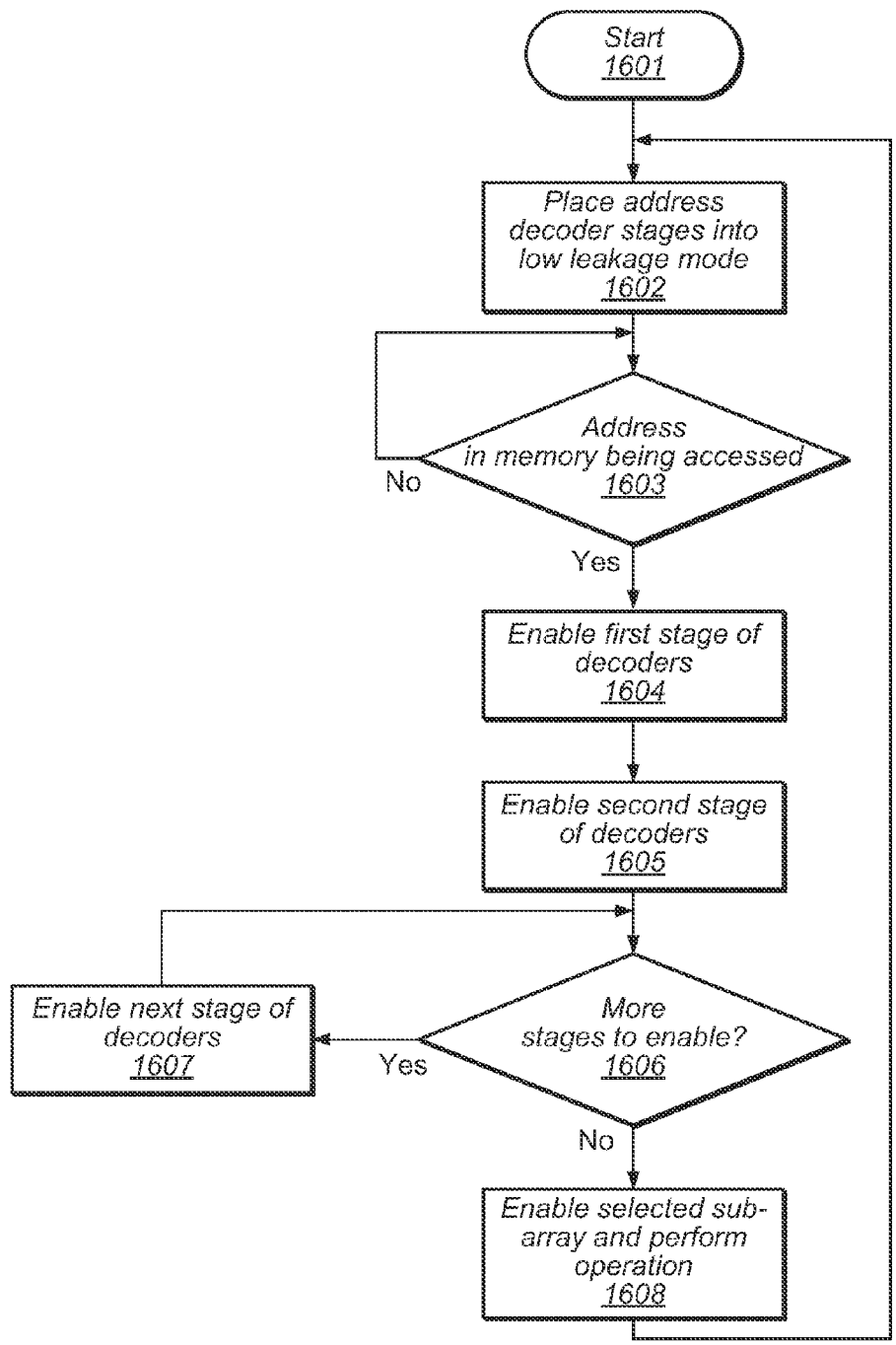
FIG. 16 illustrates a flowchart of an embodiment of a method for managing power in an address decoder.

Looking now at FIG. 16, a more detailed method is illustrated for using an address decoder to select an addressed sub-array in a memory with multiple sub-arrays, such as, for example, sub-arrays 201 of memory 200 in FIG. 2. Referring collectively to memory 200 in FIG. 2, address decoder 300 in FIG. 3 and the flowchart in FIG. 16, the method may begin in block 1601.

When no address located within memory 200 is being accessed, timing and control unit 202 may place address decoder 300 into a low leakage state (block 1602). In some embodiments, timing and control unit 202 may also place any sub-arrays currently running in a full operational mode into a data retention mode. The low leakage state of address decoder 300 may include decoupling a power source from some or all of the decode stages, such as, for example, decode 301, decode 310 and/or final decode 320.

The method may depend on a value of an address (block 1603). If a command is accompanied by an address corresponding to a location in memory 200, then the command and address may be sent to memory 200 and decode 301 may then be enabled in block 1604. Otherwise, the method may remain in block 1603 waiting for the next command and address. To determine if the address accompanying the command corresponds to a location within memory 200, timing and control unit 201 may use a subset of the address bits. The subset of bits may correspond to one or more of the most significant bits of the address.

When a location within memory 200 is being addressed, one or more decode blocks in decode 301 may be activated (block 1604). In some embodiments, activating the decode blocks may include coupling a power supply to the decode blocks being enabled. In some embodiments, the address sent to memory 200 may be a logical address which may require mapping to a physical address before being input into decode 301. In other embodiments, the address may be sent to memory 200 already mapped to a physical address. The command may include a read and/or write operation which may cause a read and or write enable signal, such as RD_EN 331 or WR_EN 332, to be asserted. Activation of decode blocks in decode 301 may depend on RD_EN 331 or WR_EN 332. In some embodiments, activation of decode 301 may depend on one or more of the address bits such as, for example, the most significant bit. Decode 301 may generate a first stage output.

One or more decode blocks in decode 310 may be enabled (block 1605). Enabling the one or more decode blocks may include coupling a power supply to selected blocks. The one or more decode blocks may be selected dependent upon the first stage output. A given decode block of decode 310 may be enabled if one or more inputs from the first stage output going into the given decode block are asserted. Since any given decode block of the second stage may receive the outputs of only a subset of the decode blocks of decode 301, power may be saved by not enabling a decode block that does not receive an asserted output from decode 301. In other words, if all inputs to a decode block are not asserted, then the output of that decode block also may not be asserted. The selected decode blocks of decode 310 may generate a second stage output.

The method may depend upon a number of stages included in address decoder 300 (block 1606). An address decoder may have only a single stage or may have many stages. To determine a specific row and/or column(s) corresponding to the address, all stages of the address decoder may need to generate a corresponding output. Address decoder 300 is illustrated with three stages, with final decode 320 corresponding to the final stage. If final decode 320 has not generated an output, then the method may move to block 1607 to enable the next stage. Otherwise, if final decode 320 has generated an output, the method may move to block 1608 to select a sub-array that includes the decoded address.

If final decode 320 has not generated an output, one or more decode blocks in final decode 320 may be enabled (block 1607). The process for enabling selected decode blocks in final decode 320 may be as described in regards to decode 310 in block 1605, using the second stage output as the input to final decode 320. Again, only decode blocks receiving asserted inputs from the second stage output may be enabled. Final decode 320 may generate a final stage output, which may correspond to an enable signal for a single word line of memory 200. In some embodiments, the final stage output may include enable signals for one or more bit lines of memory 200.

If final decode 320 has generated the final stage output, then a sub-array 201 corresponding to the final stage output may be enabled (block 1608). Enabling the sub-array may include switching a power supply to the sub-array from a sleep mode power supply to an operational power supply which may have a higher voltage level than the sleep mode power supply. The sub-array may be selected once a word line corresponding to the address has been selected. In other embodiments, a sub-array may be identified and enabled before a specific word line has been selected. For example, in some embodiments, the second stage output may include enough detail to identify the corresponding sub-array 201 before the final stage output selects the corresponding word line. Once the corresponding sub-array 201 has been enabled and the word line and bit line(s) have been selected, the operation associated with the sent command may be executed. After execution of the operation has completed, the method may return to block 1602.

It is noted that the method represented in FIG. 16 is merely an example for presenting the concepts disclosed herein. In other embodiments, a different number of steps may be included. Steps may also be performed in a different order than illustrated.

Voltage Regulation for Data Retention

Figure 6:
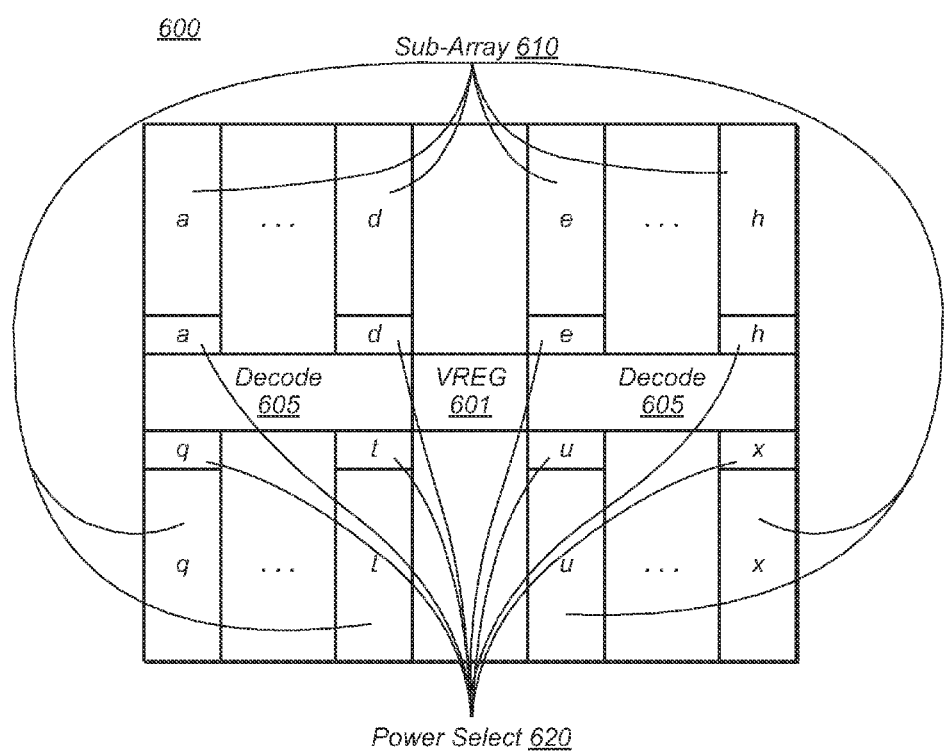
FIG. 6 illustrates a block diagram of a memory array.

Moving now to FIG. 6, an embodiment of a memory array is illustrated. Memory array 600 may include voltage regulator 601, address decode logic 605, and multiple sub-arrays 610a through 610x, coupled to regulator 601 and decode logic 605.

Voltage regulator 601 may provide one or more supply signals to sub-arrays 610. The supply signals provided by voltage regulator 601 may include a sleep mode supply signal which may correspond to a voltage level applied to sub-arrays that have been placed into a sleep mode. The voltage level of the sleep mode supply signal may be lower than a voltage level of an operational supply signal applied to a given sub-array when the given sub-array is being accessed.

Address decode logic 605 may correspond to the address decode logic illustrated in FIG. 3. Address decode logic 605 may receive an address from a processor or memory controller and assert a given word line signal and/or one or more given bit line signals corresponding to the address, as described in relation to FIG. 3.

Sub-arrays 610a through 610x may each contain a range of memory locations. Each sub-array may include a single row of bit cells or may include multiple rows of bit cells. Bit cells of a common sub-array may receive the same power supply signal, including the sleep mode supply signal or the operational supply signal. Each sub-array 610 may function in an operational mode in which the included bit cells may be read or written or in a sleep mode in which bit cells may retain their values, but cannot be read or written without risk of corrupting their values. When a sub-array is in sleep mode, voltage regulator 601 may provide the power supply signal. Each sub-array 610 may include a power selection circuit 620a through 620x. Each power selection circuit 620 may determine which power supply signal is provided to the corresponding sub-array 610, including selecting between at least the sleep mode supply signal and the operational supply signal. Power selection circuits 620 may be controlled dependent upon the output of one or more final decode stages of an address decoder, such as, for example, address decoder 300 in FIG. 3. For example, if the output of at least one final decode stage 320 that corresponds to at least one word line included in a given sub-array 610 is asserted, then the corresponding power selection circuit 620 may switch the power supply signal for the given sub-array 610 to the operational supply signal. Conversely, if no outputs of the final decode stages 320 corresponding to word lines included in the given sub-array 610 is asserted, then the corresponding power selection circuit 620 may switch the power supply signal for the given sub-array 610 to the sleep mode supply signal. Power selection circuits 620 may also receive one or more additional control signals to control switching of the power signals.

It is noted that the embodiment illustrated in FIG. 6 is merely an example. In other embodiments, different numbers of sub-arrays and different other functional blocks may be employed.

Figure 7:
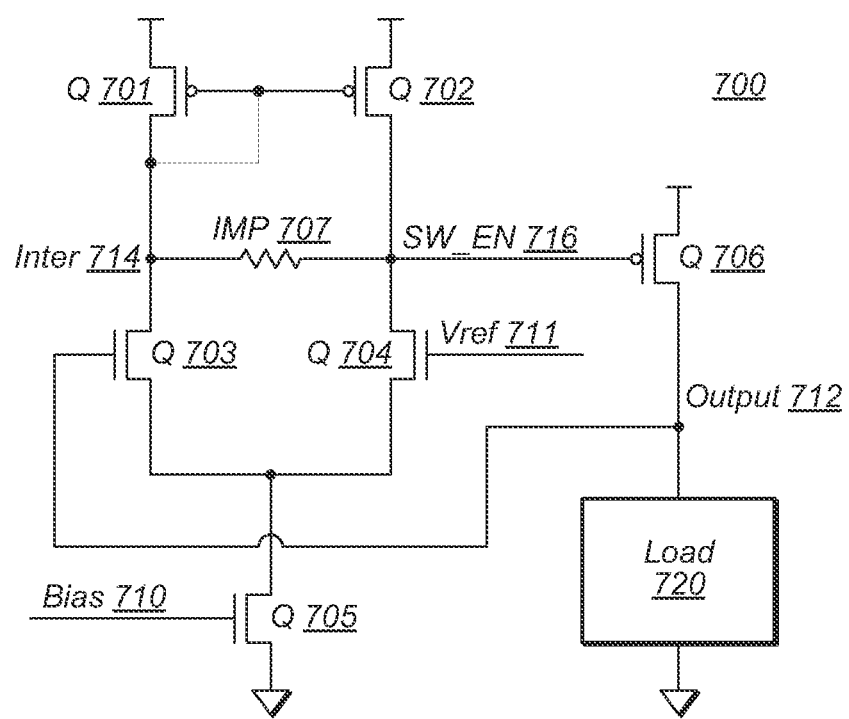
FIG. 7 illustrates an embodiment of a voltage regulator circuit.

Turning to FIG. 7 an embodiment of a voltage regulator is illustrated. Voltage regulator 700 may correspond to voltage regulator 601 in FIG. 6. Voltage regulator 700 may include transistors Q701, Q702, Q703, Q704, Q705, and Q706 as well as impedance (IMP) 707. Q701 is coupled to a supply voltage, Q702, Q703, and impedance 707. Q702 is coupled to the supply voltage, Q704, impedance 707, and Q706. Q703 is coupled to Q705 and receives a feedback signal from Q706. Q704 is coupled to Q705 and receives reference voltage (Vref) 711. Q705 is coupled to ground and receives input signal bias 710. Q706 is coupled to load 720 and acts as a pull-up device to pull output 712 towards the supply voltage when turned on.

Voltage regulator 700 receives input signals bias 710 and reference voltage Vref 711. Bias 710 and Vref 711 may be generated by any suitable reference circuit, such as, for example, a bandgap reference and may utilize one or more current mirrors. If bias 710 is low, i.e. at or near a ground reference, then Q705 is off and SW_EN 716 will eventually go high due to leakage through Q702. The high on SW_EN 716 will keep Q706 off leaving output 712 to be pulled low through load 720.

As the voltage level on bias 710 is increased, then as long as the voltage level of Vref is suitably higher than the ground reference, Q704 will turn on which will pull SW_EN 716 low, turning Q706 on, providing power to load 720 at output 712. As feedback voltage from output 712 rises above Vref 711, Q703 will start to pull intermediate node (inter) 714 low, which in turn, will start to turn Q701 and Q702 on. Q702 will pull SW_EN 716 towards the voltage supply and Q706 will start to turn off. As Q706 turns off, the voltage at output 712 will start to fall until it drops below Vref 711 again. This process of output 712 rising and falling above Vref 711 (also referred to as a voltage swing) may continue such that the voltage level of output 712 averages to the voltage level Vref 711.

Impedance 707 between SW_EN 716 and intermediate node 714 may speed the transition of SW_EN 716 from high-to-low or from low-to-high as output 712 rises and falls above and below Vref 711. Improving the transition time of SW_EN 716 may allow voltage regulator 700 respond to changes in load 720 faster. Load 720 may include power supply connections to memory cells from one or more sub-blocks, such as sub-blocks 610 in FIG. 6. Changes in the load may result from sub-blocks switching between sleep mode and normal operating mode. If voltage regulator 700 is used to provide a power supply signal to sub-blocks in sleep mode, then a sub-block leaving sleep mode and entering normal operating mode may reduce load 720 on voltage regulator 700. Conversely, a sub-block exiting normal operating mode and entering sleep mode may correspond to an increased load 720.

Impedance 707 is coupled between intermediate node 714 and SW_EN 716. In various embodiments, impedance 707 may be a resistor, such as a polycrystalline silicon resistor, or metal resistor, or any other suitable passive resistance available in a semiconductor manufacturing process. Additionally, active resistances, such as, e.g., a MOSFET biased at a particular operating point (also referred to herein as a "biased MOSFET"), may be employed, in other embodiments. It is noted that while a single resistance is depicted in the embodiment illustrated in FIG. 7, in other embodiments, resistors in series, resistors in parallel, or a combination thereof, may be used.

It is noted that FIG. 7 is merely an example. Although transistors Q701 through Q706 are depicted as being MOSFETs, in other embodiments, any suitable transconductance devices, such as, e.g., JFETs, may be employed. Other embodiments may include different numbers of transistors, and addition passive components, such as capacitors, for example. Different configurations of the transistors are possible and contemplated.

The impedance described above in reference to FIG. 7 may also include reactive components, such as, capacitors and inductors, for example. Moving to FIG. 8, another embodiment of voltage regulator is illustrated. In the illustrated embodiment, voltage regulator 800 may include complex impedance 807.

Impedance 807 may, in some embodiments, include a capacitive component in addition to a resistive component. Such a capacitive element may include a capacitor formed as a Metal-Oxide-Metal (MOM) capacitor, a Metal-Insulator-Metal (MIM) capacitor, Semiconductor-Oxide-Semiconductor (SOS) capacitor, Metal-Oxide-Semiconductor (MOS) capacitor, or any other suitable type of capacitor. Resistor 807a may be of a similar construction as impedance 707. In various embodiments, multiple capacitors may be employed, and may be coupled in series or parallel with resistor 807a. Although a capacitor is depicted in the embodiment illustrated in FIG. 8, inductors, or combinations of inductors and capacitors, may also be employed as part of impedance 807.

Adding capacitor 807b to impedance 807 may filter DC voltages on intermediate node (inter) 814 from SW_EN 816. In the description of voltage regulator 700, impedance 707 might speed the transition of SW_EN 716 in response to changes in the voltage level of output 712. With respect to voltage regulator 800, impedance 807 may provide a similar reaction. The addition of capacitor 807b may reduce the influence of DC or slow ramping voltages on intermediate node 814 and make SW_EN 816 more responsive to fast voltage transitions.

Figure 8:
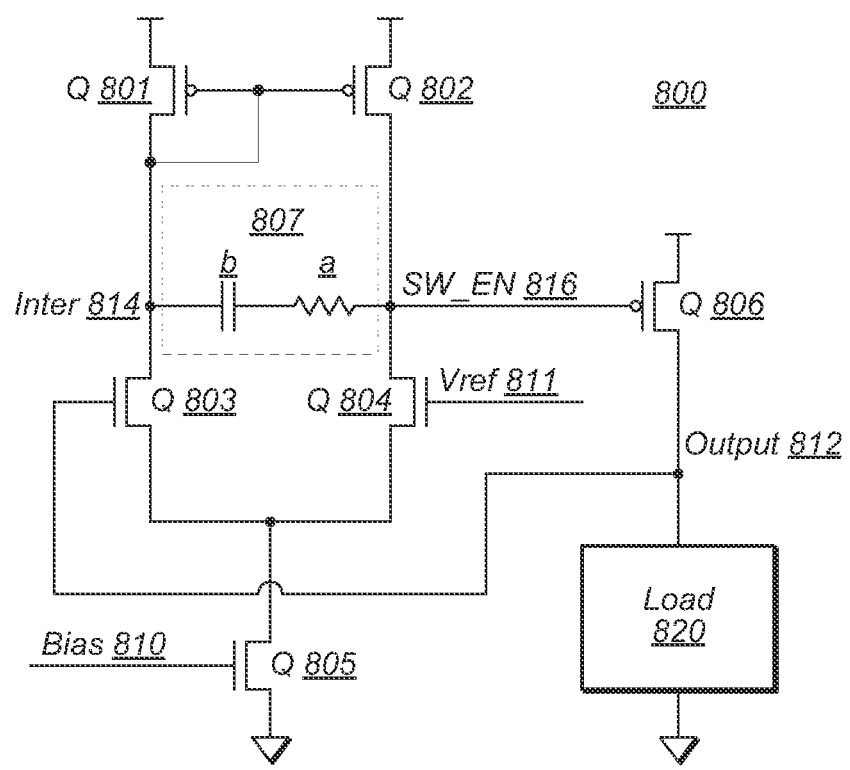
FIG. 8 illustrates another embodiment of a voltage regulator circuit.

The circuit of FIG. 8 is an example for the purpose of illustration. Other embodiments that include more transistors, capacitors, resistors or other components are possible and contemplated.

Figure 9A:
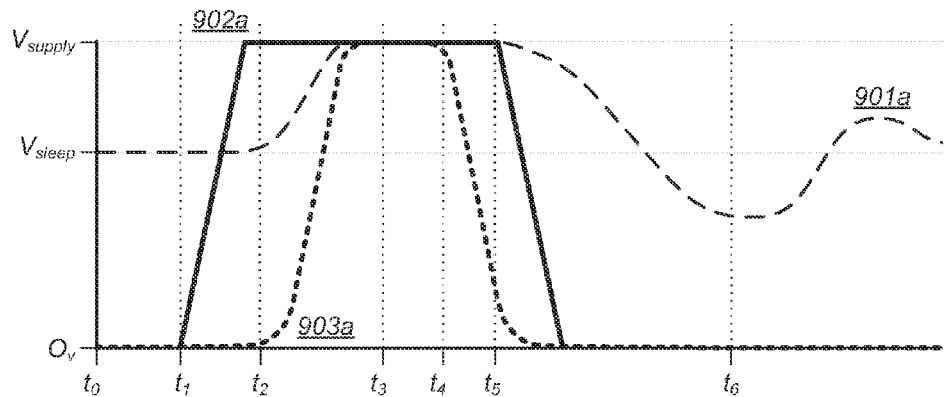
FIGS. 9(a) and 9(b), illustrates two graphs of waveforms associated with the operation of a memory sub-array.
Figure 9B:
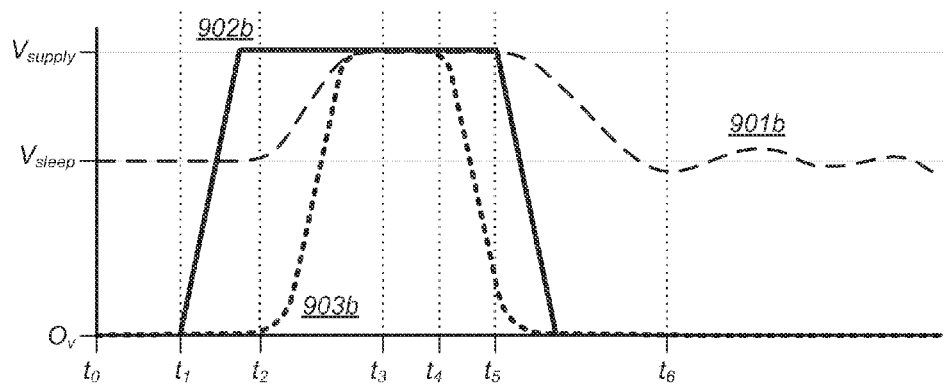

Turning to FIG. 9, which includes FIGS. 9(a) and 9(b), two sets of waveforms of voltage versus time are presented for several signals within a memory array, such as memory array 600 in FIG. 6. Referring collectively to FIG. 6, FIG. 7, and the waveforms of FIG. 9, the waveforms may include array supply, denoted 901a and 901b, enable, denoted 902a and 902b, and WL select, denoted 903a and 903b. Array supply 901a and 901b may represent a power supply input for a given sub-array, such as, e.g., sub-array 610a. Enable 902a and 902b may represent an enable signal for accessing a bit cell within sub-array 610a. WL select 903a and 903b may represent a word line select signal for a row containing the bit cell to be written. The waveforms of FIG. 9(a) may correspond to a memory array with a voltage regulator similar to voltage regulator 700 with the exception that impedance 707 is removed. The waveforms of FIG. 9(b) may correspond to a memory array with a voltage regulator similar to voltage regulator 700, including impedance 707.

Referring to FIG. 9(a), at time t0, array supply 901a may be coupled to the output of voltage regulator 700, and therefore at a Vsleep voltage level used for sub-arrays in sleep mode. Enable 902a and WL select 903a may be de-asserted. At time t1, enable 902a may assert to begin a memory operation in sub-array 610a. At time t2, array supply 901a may start to rise as the supply voltage for sub-array 610a may switch from the output of voltage regulator 700 to a system supply voltage with a higher voltage level. WL select 903a may also start to rise at time t2 dependent on the state of an address decoder used to determine the physical address within sub-array 610a. In some embodiments, the address decoder may take longer than time t2 to decode the address and in other embodiments the address decoder may take less time than t2 to decode the address.

At time t3, when WL select 903a and array supply 901a have transitioned high, the memory operation may be executed on a memory location within sub-array 610a. At time t4, WL select 903a may transition low due to a predetermined amount of time expiring or due to control logic within the memory array de-asserting WL select 903a. At time t5, enable 902a may de-assert as determined by control logic in a memory controller, such as, for example memory controller 102a. In response to the de-assertion of enable 902a, array supply 901a may switch back to the output of voltage regulator 700. Since voltage regulator 700 does not include a pull down device, only a pull up device (i.e., Q706), the voltage level on array supply 901a may drift down with leakage through sub-array 610a.

At time t6, array supply 901a may drop down to a level below Vsleep due to a slower response from voltage regulator 700 without impedance 707. Voltage regulator 700 may take some time to adjust to providing power to sub-array 610a after not having to supply power to this sub-array since the power was coming from another power supply. Due to the longer reaction time, array supply 901a may drop to a point below Vsleep and maybe below a minimum voltage level required to retain data in the memory cells. Therefore, in some embodiments, data stored in the memory cells of sub-array 610a may be corrupted and have to be re-written.

Referring now to FIG. 9(b), waveforms for array supply 901b, enable 902b, and WL select 903b may be similar to those of FIG. 9(a) at times t0 through t5. However, at time t6, voltage regulator 700 may react faster to the need to supply power to sub-array 610a. With the addition of impedance 707, voltage regulator 700 may be able to respond more quickly when the voltage level of array supply 901b falls below the voltage level of Vsleep. Due to the faster reaction, voltage regulator 700 may be able to keep array supply 901b from falling to a voltage level below the minimum voltage required to retain data and therefore, memory cells in sub-array 610a may retain their stored values.

It is noted that the waveforms of FIG. 9 are merely examples and have been simplified for demonstration. In other embodiments, waveforms may appear different due to processing variations, different technologies used to implement circuits, electro-magnetic noise, and variations in circuit design.

Figure 10:
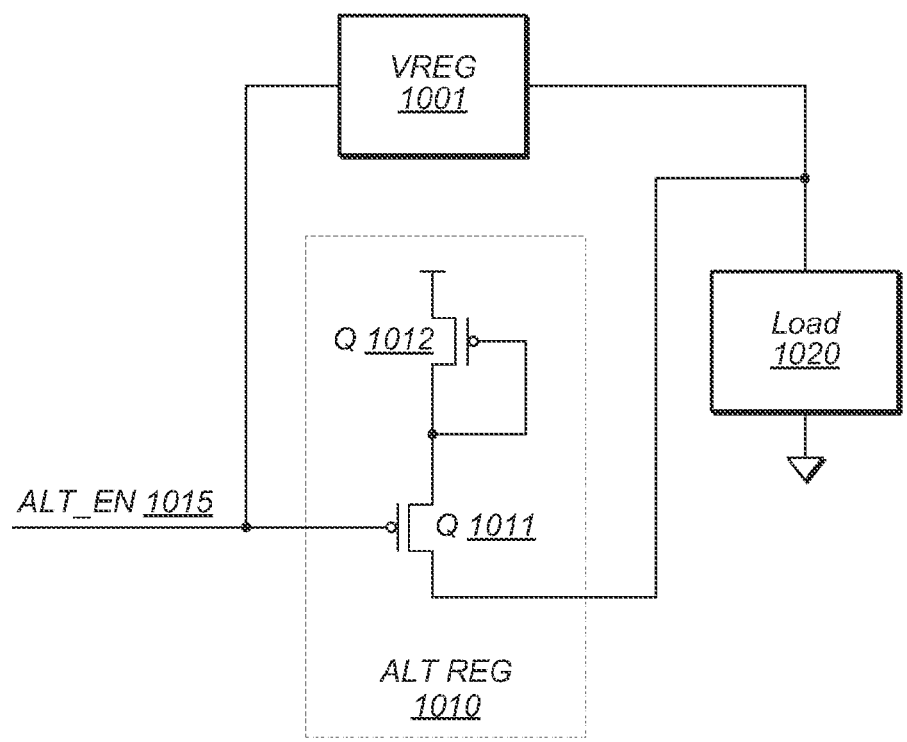
FIG. 10 illustrates an embodiment of a voltage regulation system.

Moving now to FIG. 10, a voltage regulation system is illustrated. Voltage regulating system 1000 may include voltage regulator (VREG) 1001, alternate power source (ALT REG) 1010, and load 1020 coupled to both voltage regulator 1001 and alternate power source 1010. Alternate power source 1010 may include transistors Q1011 and Q1012. Voltage regulator 1001 may correspond to voltage regulator 700 in FIG. 7 or voltage regulator 800 in FIG. 8 or other suitable voltage regulation circuit. Signal alt_en 1015 may be used to transition between the use of voltage regulator 1001 and alternate power source 1010 for providing the power supply signal for sleep mode.

If alt_en 1015 is high, then Q1011 may be off and voltage regulator 1001 may be enabled, such that voltage regulator 1001 may provide the power supply signal for sleep mode. If alt_en 1015 is low, voltage regulator 1001 may be disabled and Q1011 may be on. With Q1011 on, Q1012 may pass current from a voltage supply to the sleep mode power supply signal. Q1012 may be connected such that it functions similar to a diode. Q1012 may, therefore, incur a voltage level drop from the voltage supply side to the power supply signal side. This voltage drop may be commonly referred to as a diode threshold drop. The diode threshold level may determine the sleep mode power supply voltage level when alternate power source 1010 is enabled, such that the larger the diode threshold, the lower the sleep mode power supply voltage level.

FIG. 10 is one example of a voltage regulation system. In other embodiments, the polarity of the signal alt_en 1015 may be reversed.

Figure 11:
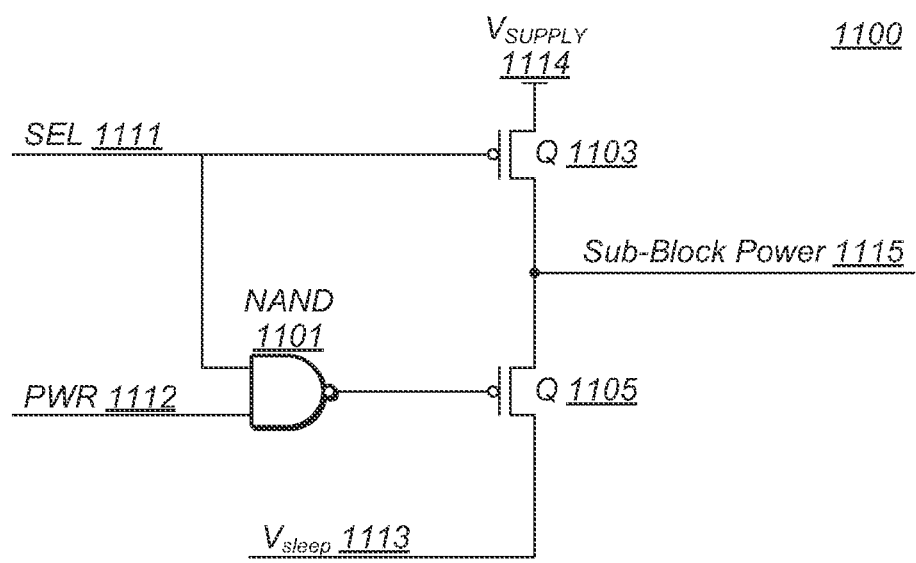
FIG. 11 illustrates an embodiment of a power selection circuit for a memory sub-array.

Turning to FIG. 11, a circuit for power selection within a sub-array is illustrated. Power selection circuit 1100 may, in some embodiments, correspond to power selection circuits 620 in FIG. 6. Power selection circuit 1100 may include NAND gate 1101, transistor Q1103, and transistor Q1105. Input signals SEL 1111 and PWR 1112 may be used for selecting between power supply signals Vsleep 1113 and Vsupply 1114 to be output as sub-block power 1115. In some embodiments, Vsleep 1113 may correspond to the output of a voltage regulator, such as, for example, voltage regulator 700 in FIG. 7 or voltage regulator 800 in FIG. 8. In other embodiments, Vsleep 1113 may correspond to the output of alternate regulator 1010 in FIG. 10.

SEL 1111 may control Q1103 and be an input to NAND 1101. If SEL 1111 is low, then NAND 1101 may be high regardless of the value of PWR 1112 and Q1103 may be on, creating a path for Vsupply 1114 to be coupled to sub-block power 1115, thereby supplying the power to the sub-block. Since NAND 1101 is high, Q1105 may be off, decoupling Vsleep 1113 from sub-block power 1115.

If SEL 1111 is high, then Q1103 may be off, decoupling Vsupply 1114 from sub-block power 1115. If PWR 1112 is high, then both inputs to NAND 1101 are high and NAND 1101 output will be low, thereby turning Q1105 on. Q1105 may then couple Vsleep 1113 to sub-block power 1115, thereby supplying the power to the sub-block. If PWR 1112 is low, however, then NAND 1101 output may be high causing Q1105 to be off. In this case, Vsupply 1114 and Vsleep 1113 may both be decoupled from sub-block power 1115, which may correspond to a power down state for the sub-block.

It is noted that the embodiment of FIG. 11 is merely an example. In other embodiments, different circuit topologies may be employed.

Figure 12:
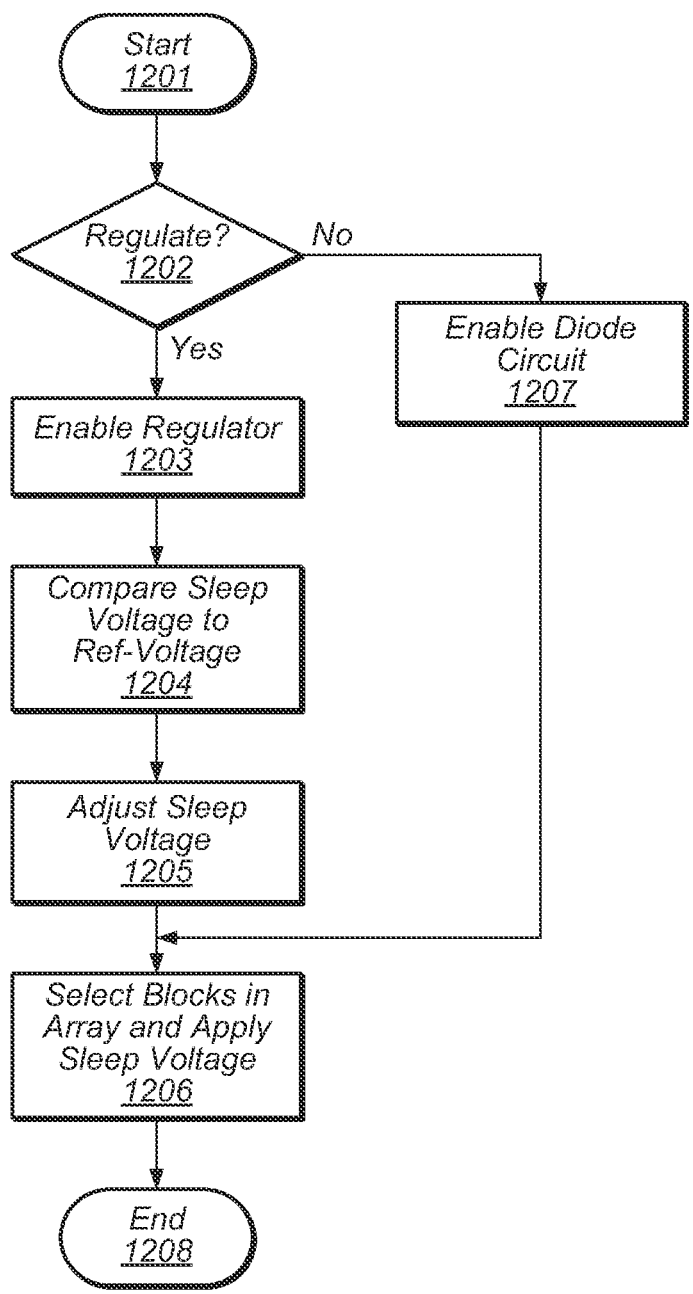
FIG. 12 illustrates a flowchart depicting an embodiment of a method for regulating voltage in a memory array.

Moving on to FIG. 12, a flowchart for a method for generating a regulated power supply to a memory array is illustrated. The method of FIG. 12 may be applied to memory array 600 of FIG. 6 and to voltage regulator 700 of FIG. 7 or voltage regulator 800 of FIG. 8. Referring collectively to FIG. 6, FIG. 7, and the flowchart of FIG. 12, the method may begin in block 1201.

The method may depend on a decision to regulate (block 1202). A decision may be made between using a voltage regulator such as, e.g., voltage regulator 700, or using an alternate power supply such as, alternate power source 1010 in FIG. 10, for example. In some embodiments, voltage regulator 700 may be disabled when alternate power source 1010 is in use. For example, if voltage regulator 700 does not perform as expected, then alternate power source 1010 may be selected, in which case, the method may move to block 1207. Otherwise, if voltage regulator 700 is the preferred source for the regulated power supply, then the method may move to block 1203.

Voltage regulator 700 may be enabled in preparation for supplying power to one or more sub-blocks of memory array 600 (block 1203). A processor in the system, such as, for example, processor 101 in FIG. 1, may enable voltage regulator 700 by driving a signal, such as alt_en in FIG. 10, high.

The output of voltage regulator 700, output 712, may be compared to a reference voltage, such as Vref 711 (block 1204). Vref 711 may correspond to a desired voltage level for output 712. Vref 711 may be a signal generated externally to the memory. In other embodiments, a band gap reference, or any other suitable supply and/or temperature independent reference circuit may be employed within the memory to generate Vref 711.

Output 712 may be adjusted based on the comparison of block 1204 (block 1205). If output 712 rises above Vref 711, then output 712 may be adjusted lower by turning Q706 off. If output 712 is lower than Vref 711, then output 712 may be adjusted higher by turning Q706 on.

Blocks may be chosen to receive output 712 (block 1206). A power selection circuit, such as power selection circuit 1100 in FIG. 11 may be used to determine if a given sub-block in memory array 600 is to receive output 712 as a power supply signal or an operating voltage such as Vsupply 1114 in FIG. 11. Address decode logic, such as address decode logic 605, may determine which sub-block of memory array 600 is accessed in a given memory access command from a processor, such as processor 101 in FIG. 1, and assert a corresponding word line associated with a given sub-block. The asserted word line may be used to select the sub-block containing the memory location being accessed by the command from processor 101. A power selection circuit corresponding to the sub-block may be used to select Vsupply 1114 as the power supply signal for this sub-block. Power selection circuits corresponding sub-blocks that do not include the memory location addressed by the command from processor 101 may be used to select output 712 from voltage regulator 700 as the power supply signal for these sub-blocks. The method may end in block 1208.

If alternate power source 1010 was selected in block 1202, then alternate power source 1010 may be enabled (block 1207). Processor 101 may enable alternate power source 1010 by driving a signal, such as alt_en 1015 in FIG. 10, low. A low value on alt_en 1015 may disable voltage regulator 700 and enable a path from a supply voltage through diode 1012 in FIG. 10. The voltage level of the output of alternate power source 1010 may be the voltage level of the supply voltage minus the diode threshold of diode 1012. This value may be used as the regulated voltage supply supplied to the sub-blocks in memory array 600 when these blocks are placed into sleep mode.

It is noted that the method of FIG. 12 is merely an example. In other embodiments, different operations and different orders of operations are possible and contemplated.

Global Write Driver

Figure 13:
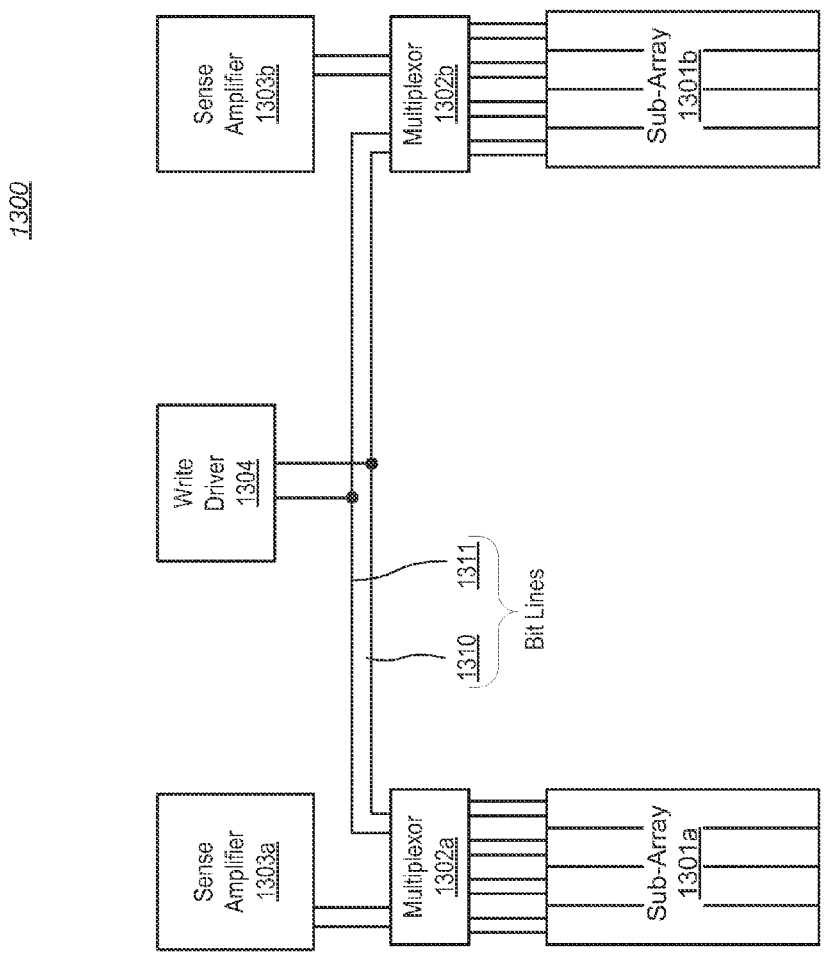
FIG. 13 illustrates a block diagram of sub-arrays of a memory array.

Switching to FIG. 13 a block diagram of an embodiment of a portion of a memory array is illustrated. FIG. 13 shows two sub-arrays from a memory array such as memory array 600 in FIG. 6. Sub-arrays 1301a and 1301b are coupled to multiplexors 1302a and 1302b, respectively. Each sub-array 1301 is also coupled to a respective sense amplifier (also referred to herein as a "sense amp") 1303a and 1303b. A single write driver 1304 is coupled to both sub-array 1301a and sub-array 1301b.

Sub-array 1301 may include one or more columns of bit cells and one or more rows of bit cells per column. A word of data may be stored within one row across multiple sub-arrays. As used herein, a "word" of data, or a "data word" may refer to the number of bits read or written through a memory interface in parallel and may correspond to 8-, 16-, 32-, or more bits.

Multiplexors 1302 may be used to select a column to be read or written for a given read or write of a data word. Sense amps 1303a and 1303b may be used for reading data from bit cells selected by multiplexors 1302 during a read access. Each sense amp 1303 may read a single bit cell, as selected by the corresponding multiplexor 1302, at a time.

Write driver 1304 may be used for writing data to bit cells selected by multiplexors 1302 during a write access. Instead of having a write driver 1304 for each sub-array 1301, a single write driver 1304 may be coupled to two or more sub-arrays 1301 within a memory array. Write driver 1304 may be coupled to the two or more sub-arrays 1301 through bit lines 1310 and 1311. Write driver 1304 may be coupled to two or more sub-arrays 1302 that do not share a common address. For example, sub-array 1301a may only contain bits for a block of even addresses and sub-array 1301b may only contain bits for a block of odd addresses. In such an embodiment, write driver 1304 would not have to write to a bit in both sub-array 1301a and 1301b at the same time since only a single address may be accessed at a time. Other methods of dividing addresses between sub-blocks 1301a and 1301b, in addition to the even/odd distribution example, are known and contemplated.

FIG. 13 is intended as an example for the purpose of demonstrating the concepts disclosed herein. In other embodiments, more and or different functional blocks may be included. Functional blocks may also be arranged differently from the illustration.

Figure 14:
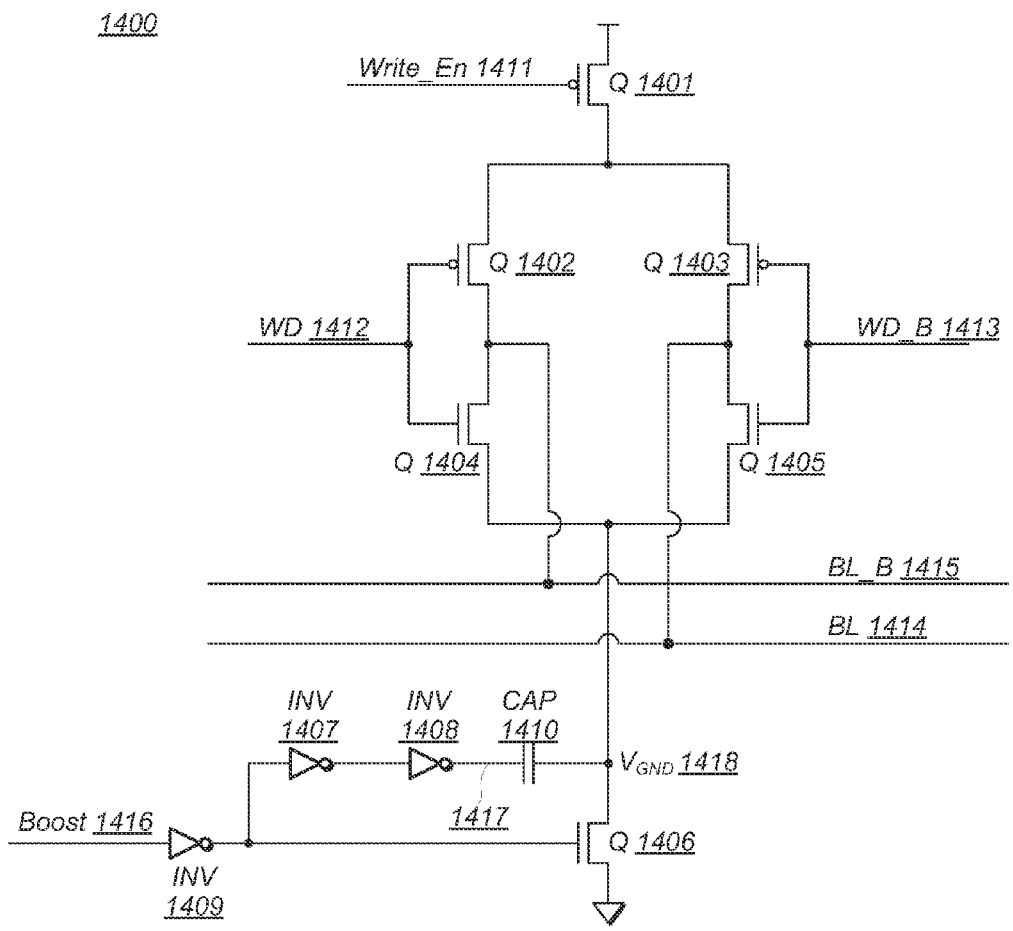
FIG. 14 illustrates an embodiment of a write driver circuit for a memory array.

Moving to FIG. 14, an embodiment of a circuit for a shared write driver is illustrated. Shared driver 1400 may correspond to write driver 1304 in FIG. 13. Shared driver 1400 may include transistors Q1401, Q1402, Q1403, Q1404, Q1405, and Q1406, as well as inverters INV1407, INV1408, and INV1409, and capacitor (CAP) 1410. Shared driver 1400 may also receive input signals write_en 1411, write data (WD) 1412, inverse write data (WD_B) 1413, and boost 1416. Bit line (BL) 1414 and complement bit line (BL_B) 1415 may be outputs of shared driver 1400.

Write_en 1411 may help reduce power consumption due to leakage when high by turning Q1401 off, as this may decouple the supply voltage from shared driver 1400. When write_en 1411 is low, the supply voltage may be coupled to shared driver 1400. Boost 1416 may normally be low, turning Q1406 on and coupling shared driver 1400 to ground at virtual ground 1418. Q1402 and Q1404 may invert the value of write data 1412 and Q1403 and Q1405 may invert the value of inverse write data 1413, such that complement bit line 1415 is driven by Q1402 and Q1404 and bit line 1414 is driven by Q1403 and Q1405.

In some embodiments, a voltage level of a power supply to a bit cell to be written may not be as high as desired to ensure a successful write to the bit cell. In such circumstances the voltage difference between data and complement data being stored in a bit cell may be increased to improve the likelihood of a successful write operation. A negative boost (also referred to as "write assist") may be employed to provide the added margin to the write operation. Boost 1416 may be used to control a negative boost operation of write driver 1400. When boost 1416 is low, INV1409 may output a high signal, turning Q1406 on and coupling virtual ground ($V_{GND}$) 1418 to ground. The high output of INV1409 may also cause INV1407 to output a low signal and thereby cause INV1408 to output a high signal at node 1417. Capacitor 1410 may charge in response to node 1410 being at a high level and virtual ground being at ground.

When a boost may be needed to make sure bit line 1414 and complement bit line 1415 are set correctly, boost 1416 may be driven high. In response to the high signal on boost 1416, INV1409 may go low, turning Q1406 off and decoupling virtual ground from the ground signal. INV1407 may output a high and thereby cause INV1408 to output a low. Since capacitors resist sudden changes in voltage, capacitor 1410 may try to maintain the voltage level across its terminals. Since node 1417 is being driven to ground by INV1408, the voltage stored on capacitor 1410 may force virtual ground 1418 to a negative, i.e., below ground reference, voltage level. Since signals bit line 1414 and inverse bit line 1415 are complementary when shared driver 1400 is active, one of the two signals will be a low value when coupled to the bit cell to be written. The negative voltage level on virtual ground 1418 (which is coupled to the sources of transistors Q1404 and Q1405) may push the low value of signals bit line 1414 and inverse bit line 1415 below ground. The negative boost on the low bit line may help to successfully write a bit cell by overcoming weakness in the high-side drivers due to a low supply voltage, processing variations, and the like, within bit cells of the memory. This negative boost may allow shared driver 1400 to support more than one sub-block. Reducing the number of write drivers in a memory array may save die area and may reduce power consumption.

The amount of negative boost required may be a function of numerous factors. Once an appropriate amount of boost is determined, a value of capacitor Q1406 may then be determined. In some embodiments, capacitor Q1406 may of sufficient size, that when repeated across multiple sub-arrays, an overall increase in the area of the memory results. By sharing the write driver between multiple sub-arrays, the impact on the overall area of the memory may, in some embodiments, be reduced.

It is noted that capacitor 1410 is a particular embodiment of a different types of capacitors available on a semiconductor manufacturing process. Capacitor 1410 may, in various embodiments, be formed as a Metal-Oxide-Metal (MOM) capacitor, a Metal-Insulator-Metal (MIM) capacitor, a gate oxide capacitor, or other suitable capacitive structure.

It is noted that the embodiment illustrated in FIG. 14 is merely an example. In other embodiments, additional circuit elements may be included. The physical arrangement of circuit elements may vary by design in various embodiments.

Figure 15:
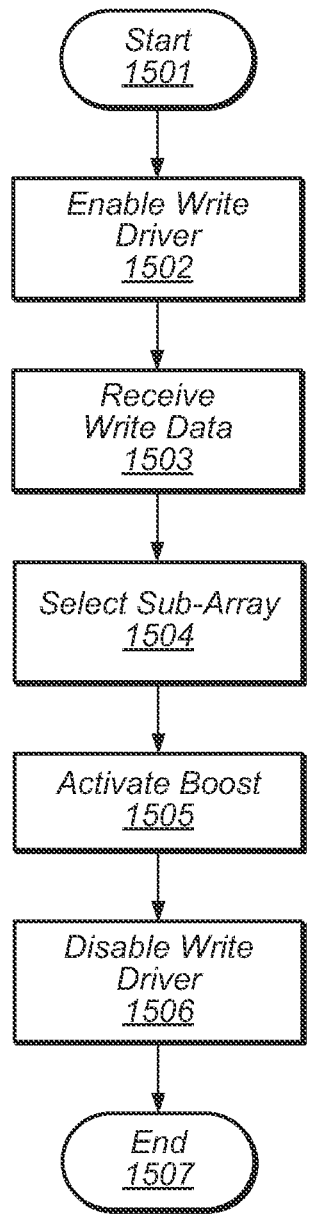
FIG. 15 illustrates a flowchart for a method for writing data in a memory array.

Turning now to FIG. 15, a flowchart for a method for operating a shared write driver is presented. The method may be applied to a write driver, such as shared driver 1400 in FIG. 14, operating with sub-arrays such as sub-arrays 1301 in FIG. 13. Referring collectively to FIG. 13, FIG. 14 and the flowchart of FIG. 15, the method may begin in block 1501.

A shared write driver, such as shared driver 1400, may be enabled (block 1502). Shared driver 1400 may support write operations for multiple sub-arrays, such as sub-arrays 1301a and 1301b. If a memory location in sub-array 1301b, for example, is selected for a write operation, then control logic may assert write_en 1411 to enable shared driver 1400.

Data to be written to the memory location in sub-array 1301b may be driven on write data 1412 (block 1503). The complement value of the data to be written may be driven on complement write data 1413. The data may correspond to a given bit of a given data word to be stored in the memory.

Sub-array 1301b may be selected as the sub-array containing the memory location to be written (block 1504). Sub-array 1301b may be selected by an address decoder, such as, for example, address decoder 300 in FIG. 3. In some embodiments, address decoding may occur in more than one stage. In such embodiments, sub-array 1301b may be selected before a complete address is decoded since sub-array 1301b may contain multiple word lines. For example, if a sub-array contains 16 word lines, then the address may only need to be narrowed down to a block of 16 words in order to know which sub-array includes the memory location.

Shared driver 1400 may be activated and the bit cells corresponding to the memory location may be written (1505). Activation of shared driver 1400 may also include selecting the corresponding row and columns in sub-array 1301b to connect bit line 1414 and inverse bit line 1415 of shared driver 1400 to the addressed memory location. With the row and columns selected, boost 1416 may be asserted to help provide a sufficient voltage level on bit line 1414 or complement bit line 1415.

Shared driver 1400 may be disabled upon completion of the write operation (block 1506). In some embodiments, a predetermined amount of time may elapse before shared driver 1400 is disabled to complete the write operation. In other embodiments, a write time may be determined by a memory controller, such as memory controller 102a in FIG. 1 may determine a write time based on operating conditions such as current supply voltage level or a current temperature within the system. Shared driver 1400 may be disabled by driving boost 1416 low and driving write_en high. In some embodiments, shared driver 1400 may be in a low power state when disabled. The method may end in block 1507.

It is noted that the method represented in FIG. 15 is merely an example for presenting the concepts disclosed herein. In other embodiments, a different number of steps may be included. Steps may also be performed in a different order than illustrated.

Numerous variations and modifications will become apparent to those skilled in the art once the above disclosure is fully appreciated. It is intended that the following claims be interpreted to embrace all such variations and modifications.

What is claimed is:

1. A system, comprising:
   a processor;
   a memory unit, wherein the memory unit includes a plurality of sub-arrays; and
   a voltage regulator circuit coupled to the memory unit, wherein the voltage regulator circuit is configured to:
   generate a first power supply voltage, wherein the first power supply voltage is provided to the memory unit, and wherein a level of the first power supply voltage is less than a level of a second power supply voltage provided to the memory unit;
   adjust a voltage level of a first output node and a voltage level of a second output node dependent upon the level of the first power supply voltage and a level of a reference voltage;
   adjust the level of the first power supply voltage dependent upon the voltage level of at least one of the first output node and the second output node; and
   couple the first output node to the second output node via an impedance, wherein the impedance includes a capacitor in series with a resistor.

2. The system of claim 1, wherein the level of the first power supply voltage is less than an operational voltage level of at least one of the plurality of sub-arrays.

3. The system of claim 1, wherein the memory unit is configured to:
   selectively provide the first power supply voltage to at least one of the plurality of sub-arrays; and
   switch the at least one of the plurality of sub-arrays into a reduced power mode.

4. The system of claim 3, wherein the memory unit is further configured to stop providing the first power supply voltage from the at least one of the plurality of sub-arrays, and provide the second power supply voltage to the at least one of the plurality of sub-arrays responsive to receiving a request from the processor to access a memory location in the at least one of the plurality of sub-arrays.

5. The system of claim 4, wherein the memory unit is further configured to stop providing the second power supply voltage and provide the first power supply voltage to the given one of the plurality of sub-arrays responsive to a determination that the access of the memory location has completed.

6. The system of claim 1, wherein the memory unit is further configured to stop providing the first power supply voltage and provide a third power supply voltage to the plurality of sub-arrays dependent upon an enable signal.

7. The system of claim 1, wherein the impedance includes a metal oxide semiconductor field-effect transistor (MOSFET), wherein the MOSFET is biased at a predetermined operating point.

8. A method for operating a memory, the method comprising:
   sourcing a current to a first power node coupled to a plurality of sub-arrays of a memory array in the memory;
   adjusting a voltage level of a first output node and a voltage level of a second output node dependent upon a voltage level at the first power node and a voltage level of a reference node;
   adjusting a level of the current dependent upon the voltage level of at least one of the first output node and the second output node;
   coupling, by a capacitor in series with a resistor, the first output node and the second output node.

9. The method of claim 8, wherein the voltage level at the first power node is less than an operational voltage level of at least one of the plurality of sub-arrays.

10. The method of claim 8, wherein a voltage level at the first power node is less than a voltage level of a second power node.

11. The method of claim 10, further comprising switching a given of the plurality of sub-arrays into a reduced power mode when the given one of the plurality of sub-arrays is coupled to the first power node.

12. The method of claim 8, further comprising disabling the sourced current to the first power node and providing a secondary current to the first power node dependent upon an enable signal.

13. The method of claim 10, further comprising decoupling a selected one of the plurality of sub-arrays from the first power node and coupling the selected one of the plurality of sub-arrays to the second power node dependent upon a memory access of the selected one of the plurality of sub-arrays.

14. The method of claim 13, further comprising decoupling the selected one of the plurality of sub-arrays from the second power node and coupling the selected one to the first power node responsive to a determination that the memory access of the selected one has completed.

15. A voltage regulator, comprising:
- a first current source configured to source current to a power node coupled to a memory array;
- a differential amplifier configured to adjust a voltage level of a first output node and a voltage level of a second output node dependent upon a voltage level of the power node and a voltage level of a reference node; and
- an impedance circuit coupled between the first output node and the second output node;
- wherein the first current source is further configured to adjust the current to the power node dependent upon the voltage level of the second output node.

16. The voltage regulator of claim 15, wherein the impedance circuit includes at least one resistor.

17. The voltage regulator of claim 16, wherein the impedance circuit further includes at least one capacitor, and wherein the at least one capacitor is coupled in series with the at least one resistor.

18. The voltage regulator of claim 16, wherein the resistor includes a metal oxide semiconductor field-effect transistor (MOSFET), wherein the MOSFET is biased at a predetermined operating point.

19. The voltage regulator of claim 15, wherein a voltage level of the power node is less than an operational voltage level of the memory array.

20. The voltage regulator of claim 19, further comprising a second current source configured to source current to the power node responsive to an enable signal, wherein the first current source is disabled when the second current source is enabled.

* * * * *